(12) United States Patent
Babu et al.

(10) Patent No.: US 7,143,046 B2
(45) Date of Patent: Nov. 28, 2006

(54) SYSTEM AND METHOD FOR COMPRESSING A DATA TABLE USING MODELS

(75) Inventors: Shivnath Babu, Menlo Park, CA (US); Minos N. Garofalakis, Chatham Township, NJ (US); Rajeev Rastogi, New Providence, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 634 days.

(21) Appl. No.: 10/033,199

(22) Filed: Dec. 28, 2001

(65) Prior Publication Data

US 2003/0130855 A1 Jul. 10, 2003

(51) Int. Cl.
*G06F 7/00* (2006.01)
*G06F 17/30* (2006.01)
(52) U.S. Cl. ...................................... 704/500; 707/101
(58) Field of Classification Search ................ 704/245, 704/255, 500, 501, 503; 707/100, 101, 102
See application file for complete search history.

(56) References Cited

U.S. PATENT DOCUMENTS 5,537,589 A * 7/1996 Dalal .......................... 707/101
5,799,311 A * 8/1998 Agrawal et al. ............. 707/102
6,031,995 A * 2/2000 George ........................ 717/166
6,189,005 B1 * 2/2001 Chakrabarti et al. ........... 707/6
6,247,016 B1 * 6/2001 Rastogi et al. ............... 707/101
6,308,172 B1 * 10/2001 Agrawal et al. ................ 707/5
6,473,757 B1 * 10/2002 Garofalakis et al. ............ 707/6
6,542,894 B1 * 4/2003 Lee et al. .................... 707/101
6,581,058 B1 * 6/2003 Fayyad et al. .................. 707/6
6,633,882 B1 * 10/2003 Fayyad et al. ............... 707/101
6,651,048 B1 * 11/2003 Agrawal et al. ................ 707/2
6,760,724 B1 * 7/2004 Chakrabarti et al. ........... 707/4
6,810,368 B1 * 10/2004 Pednault ........................ 703/2

OTHER PUBLICATIONS

Jagadish et al., "Semantic Compression and Pattern Extraction with Fascicles," Proceedings of the 25th VLDB Conference, 1999, pp. 186 to 197.*

* cited by examiner

*Primary Examiner*—Martin Lerner

(57) ABSTRACT

A system for, and method of compressing a data table using models and a database management system incorporating the system or the method. In one embodiment, the system includes: (1) a table modeller that discovers data mining models with guaranteed error bounds of at least one attribute in the data table in terms of other attributes in the data table and (2) a model selector, associated with the table modeller, that selects a subset of the at least one model to form a basis upon which to compress the data table.

23 Claims, 8 Drawing Sheets

FIG. 2

The Greedy CaRT Selection Algorithm procedure Greedy $(T(X), \bar{e}, G, \theta)$
Input: n-attribute table T and n-vector of error tolerances $\bar{e}$; Bayesian network G on the set of attributes X and threshold $\theta$ on the relative benefit for selecting a CaRT predictor.
Output: A set of materialized (predicted) attributes $X_{mat}$ ($X_{pred} = X - X_{mat}$) and a CaRT predictor for each $X_i \in X_{pred}$.

begin
1. $X_{mat} := X_{pred} := \Phi$
2. let $<X_1, X_2,...,X_n>$ be the attributes in X sorted in *topological order* of G
3. for i := 1,...,n
4. if $\Pi(X_i) = \Phi$ then $X_{mat} := X_{mat} \cup \{X_i\}$  /* $X_i$ must be materialized if it has no parents in G */
5. else
6. $M := \text{BuildCaRT}(X_{mat} \rightarrow X_i, e_i)$
7. if (MaterCost $(X_i)$ / PredCost $(X_{mat} \rightarrow X_i) > \theta$) then $X_{pred} := X_{pred} \cup \{X_i\}$
8. else $X_{mat} := X_{mat} \cup \{X_i\}$
9. end
10. end
end

BAYESIAN NETWORK G (b) Gtemp (FIRST ITERATION)

Gtemp (SECOND ITERATION)

Gtemp (THIRD ITERATION)

FIG. 4

The MaxIndependentSet CaRT Selection Algorithm procedure MaxIndependentSet ($T(X)$, $\bar{e}$, $G$, neighborhood() )
Input: n-attribute table $T$ and n-vector of error tolerances $\bar{e}$; Bayesian network $G$ on the set of attributes $X$ and function neighborhood () defining the "predictive neighborhood" of a node $X_i$ in $G$ (e.g., $\Pi(X_1)$ or $\beta(X_i)$).
Output: A set of materialized (predicted) attributes $X_{mat}$ ($X_{pred} = X - X_{mat}$) and a CaRT predictor PRED $(X_i) \rightarrow X_i$ for each $X_i \in X_{pred}$.
begin
1.    $X_{mat} := X$, $X_{pred} := \phi$
2.    PRED $(X_i) := \phi$ for all $X_i \in X$, improve := true
3.    while (improve $\neq$ false) do
4.        for each $X_i \in X_{mat}$
5.            mater_neighbors $(X_i) :=$
$(X_{mat} \cap$ neighborhood$(X_i)) \cup \{$PRED $(X) : X \in$ neighborhood $(X_i)$, $X \in X_{pred}\} - \{X_i\}$
6.            M := BuildCaRT (Mater_neighbors $(X_i) \rightarrow X_i$, $e_i$)
7.            let PRED $(X_i) \subseteq$ mater_neighbors $(X_i)$ be the set of predictor attributes used in M
8.            cost_change$_i := 0$
9.            for each $X_j \in X_{pred}$ such that $X_i \in$ PRED $(X_j)$
10.               NEW_PRED$_i$ $(X_j) :=$ PRED$(X_j) - \{X_i\} \cup$ PRED $(X_i)$
11.               M := BuildCaRT (NEW_PRED$_i$ $(X_j) \rightarrow X_j$, $e_j$)
12.               set NEW_PRED$_i$ $(X_j)$ to the (sub) set of predictor attributes used in M
13.               cost_change$_i := $ cost_change$_i + ($PredCost (PRED $(X_j) \rightarrow X_j) - $ PredCost (NEW_PRED$_i$ $(X_j) \rightarrow X_j))$
14.        end
15.    end

FIG. 4 (cont)

16. build an undirected, node-weighted graph $G_{temp} = (X_{mat}, E_{temp})$ on the current set of materialized
17. attributes $X_{mat}$, where:
18.     (a) $E_{temp} := \{ (X,Y) :$ for all pairs $X, Y \in X_{pred}\} \cup$
19.               $\{ (X_i, Y) :$ for all $Y \in X_{mat}\}$
20.     (b) weight $(X_i) :=$ MaterCost $(X_i)$ −PredCost (PRED$(X_i)$
        → $X_i$) +cost_change$_i$ for each $X_i \in X_{mat}$
21. $S :=$ FindWMIS $(G_{temp})$    /* select (approximate) maximum weight independent set in $G_{temp}$
22.                                        as "maximum-benefit" subset of predicted attributes */
23. if $(\Sigma_{X \in S}$ weight $(X) \leq 0)$ then improve := false
24. else/* update $X_{mat}, X_{pred}$, and the chosen CaRT predictors */
25.     for each $X_j \in X_{pred}$
26.        if (PRED $(X_j) \cap S = \{X_i\})$ then PRED $(X_j) :=$ NEW_PRED$_i$ $(X_j)$
27.     end
28.     $X_{mat} := X_{mat} - S,\ X_{pred} := X_{pred} \cup S$
29. end
30. end /* while */
end

FIG. 5

Algorithm for Estimating Lower Bound on Subtree Cost

```
procedure LowerBound     (N, e_i, b)
Input:  Leaf N for which lower bound on subtree cost is to be
        computed; error tolerance e_i for attribute X_i; bound b
        on the maximum number of internal nodes in subtree
        rooted at N.
Output: Lower bound L(N) on cost of subtree rooted at N.
begin
1.  for i := to r
2.      minOut [i, 0] := i
3.  for J := 1 to b + 1
4.      minOut [0, j] := 0
5.  l := 0
6.  for i := 1 to r
7.      while x_i - x_{l+1} > 2e_i
8.          l := l = 1
9.      for j := 1 to b + 1
10.         minOut [i,j] := min {minOut[i - 1,j] + 1, minOut [1,j-1]
11. end
12. L(N) := ∞
13. for J := 0 to b
14.     L(N) := min {L(N) , 2j + 1 + j log (|X_i|) + (j + 1 + minOut
            (r, j+1)) log (|dom(X_i)|)}
15. L(N) := min {L(N) , 2b + 3 + (b + 1) log (|X_i|) + (b +2) log
        (|dom(X_i)| ) }
16. return L (N)
end
```

FOREST COVER DATASET

COREL DATASET

COREL DATASET

SYSTEM AND METHOD FOR COMPRESSING A DATA TABLE USING MODELS

TECHNICAL FIELD OF THE INVENTION

The present invention is directed, in general, to data compression and, more specifically, to a system and method for compressing an arbitrary data table using models.

BACKGROUND OF THE INVENTION

Effective analysis and compression of massive, high-dimensional tables of alphanumeric data is an ubiquitous requirement for a variety of application environments. For instance, massive tables of both network-traffic data and "Call-Detail Records" (CDR) of telecommunications data are continuously explored and analyzed to produce certain information that enables various key network-management tasks, including application and user profiling, proactive and reactive resource management, traffic engineering, and capacity planning, as well as providing and verifying Quality-of-Service guarantees for end users. Effective querying of these massive data tables help to continue to ensure efficient and reliable service.

Traditionally, data compression issues arise naturally in applications dealing with massive data sets, and effective solutions are crucial for optimizing the usage of critical system resources, like storage space and I/O bandwidth (for storing and accessing the data) and network bandwidth (for transferring the data across sites). In mobile-computing applications, for instance, clients are usually disconnected and, therefore, often need to download data for offline use.

Thus, for efficient data transfer and client-side resource conservation, the relevant data needs to be compressed. Several statistical and dictionary-based compression methods have been proposed for text corpora and multimedia data, some of which (e.g., Lempel-Ziv or Huffman) yield provably optimal asymptotic performance in terms of certain ergodic properties of the data source. These methods, however, fail to provide adequate solutions for compressing a massive data table, as they view the table as a large byte string and do not account for the complex dependency patterns in the table.

Existing compression techniques are "syntactic" in the sense that they operate at the level of consecutive bytes of data. As explained above, such syntactic methods typically fail to provide adequate solutions for table-data compression, since they essentially view the data as a large byte string and do not exploit the complex dependency patterns in the data structure. Popular compression programs (e.g., gzip, compress) employ the Lempel-Ziv algorithm which treats the input data as a byte string and performs lossless compression on the input. Thus, these compression routines, when applied to massive tables, do not exploit data semantics or permit guaranteed error lossy compression of data.

Attributes (i.e., a "column") with a discrete, unordered value domain are referred to as "categorical," whereas those with ordered value domains are referred to as "numeric." Lossless compression schemes are primarily used on numeric attributes and do not exploit correlations between attributes. For instance, in certain page level algorithm compression schemes, each numeric attribute, its minimum value occurring in tuples (i.e., in "rows") in the page, is stored separately once for the entire page. Further, instead of storing the original value for the attribute in a tuple, the difference between the original value and the minimum is stored in the tuple. Thus, since storing the difference consumes fewer bits, the storage space overhead of the table is reduced. Tuple Differential Coding (TDC) is a compression method that also achieves space savings by storing differences instead of actual values for attributes. However, for each attribute value in a tuple, the stored difference is relative to the attribute value in the preceding tuple.

Other lossless compression schemes have been derived that essentially partitions the set of attributes of a table T into groups of correlated attributes that compress well (by examining a small amount of training material) and then simply using gzip to compress the projection of T on each group. Another approach for lossless compression first constructs a Bayesian network on the attributes of the table and then rearranges the table's attributes in an order that is consistent with a topological sort of the Bayesian network graph. A key intuition is that reordering the data (using the Bayesian network) results in correlated attributes being stored in close proximity; consequently, tools like gzip yield better compression ratios for the reordered table.

Another instance of a lossless compression algorithm for categorical attributes is one that uses data mining techniques (e.g., classification trees, frequent item sets) to find sets of categorical attribute values that occur frequently in the table. The frequent sets are stored separately (as rules) and occurrences of each frequent set in the table are replaced by the rule identifier for the set.

However, compared to these conventional compression methods for text or multimedia data, effectively compressing massive data tables presents a host of novel challenges due to several distinct characteristics of table data sets and their analysis. Due to the exploratory nature of many data-analysis applications, there are several scenarios in which an exact answer may not be required, and analysts may in fact prefer a fast, approximate answer, as long as the system can guarantee an upper bound on the error of the approximation. For example, during a drill-down query sequence in ad-hoc data mining, initial queries in the sequence frequently have the sole purposes of determining the truly interesting queries and regions of the data table. Providing (reasonably accurate) approximate answers to these initial queries gives analysts the ability to focus their explorations quickly and effectively, without consuming inordinate amounts of valuable system resources.

Thus, in contrast to traditional lossless data compression, the compression of massive tables can often afford to be lossy, as long as some (user-defined or application-defined) upper bounds on the compression error are guaranteed by the compression algorithm. This is obviously an important differentiation, as even small error tolerances can help achieve better compression ratios.

Effective table compression mandates, therefore, using compression procedures and techniques that are semantic in nature, in the sense that they account for and exploit both (1) the meanings and dynamic ranges of individual attributes (e.g., by taking advantage of the specified error tolerances); and, (2) existing data dependencies and correlations among attributes in the table.

Accordingly, what is needed in the art is a system and method that takes advantage of attribute semantics and data-mining models to perform guaranteed error lossy compression of massive data tables.

SUMMARY OF THE INVENTION

To address the above-discussed deficiencies of the prior art, the present invention provides a system for, and method of compressing a data table and a database management system incorporating the system or the method. In one embodiment, the system includes: (1) a table modeller that discovers data mining models with guaranteed error bounds of at least one attribute in the data table in terms of other attributes in the data table and (2) a model selector, associated with the table modeller, that selects a subset of the at least one model to form a basis upon which to compress the data table.

The present invention therefore introduces the broad concept of effectively compressing data tables by taking advantage of attribute semantics and data mining models to perform lossy compression of massive data tables containing a guaranteed error.

In one embodiment of the present invention, the table modeller employs classification and regression tree data mining models to model the at least one attribute. The tree in each such model is called a "CaRT." CaRTs are by themselves conventional, but have not until now been employed for compressing data tables.

In one embodiment of the present invention, the model selector employs a Bayesian network built on the at least one attribute to select relevant models for table compression. Those skilled in the pertinent art are familiar with Bayesian networks. Such networks find their first use in guaranteed error lossy compression of data tables.

In one embodiment of the present invention, the table modeller employs a selected one of a constraint-based and a scoring-based method to generate the at least one model. Such models will be set forth in detail in the Description that follows.

In one embodiment of the present invention, the model selector selects the subset based upon a compression ratio and an error bound. Thus, a compression technique that offers maximum compression, without exceeding error tolerance, is advantageously selected. However, those skilled in the pertinent art will understand that the subset may be selected on other or further bases.

In one embodiment of the present invention, the process by which the model selector selects the subset is NP-hard. Alternatively, two novel algorithms will be hereinafter described that allow subset selection to occur faster, at some cost.

In one embodiment of the present invention, the model selector selects the subset using a model built on attributes of the data table by a selected one of: (1) repeated calls to a maximum independent set solution algorithm and (2) a greedy search algorithm. These techniques will be set forth in the Detailed Description that follows.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which:

FIG. 2 illustrates one embodiment of the procedure greedy ( ), a CaRT-selection algorithm, which may be implemented within the CaRTSelector 120;

FIG. 4 illustrates one embodiment of a procedure Max-IndependentSet ( ) CaRT-selection algorithm which alleviates some drawbacks of the greedy algorithm;

FIG. 5 illustrates one embodiment of a procedure LowerBound ( ), an algorithm for computing L(N) for each "still to be expanded" leaf N in a partial tree R;

DETAILED DESCRIPTION

Figure 1:
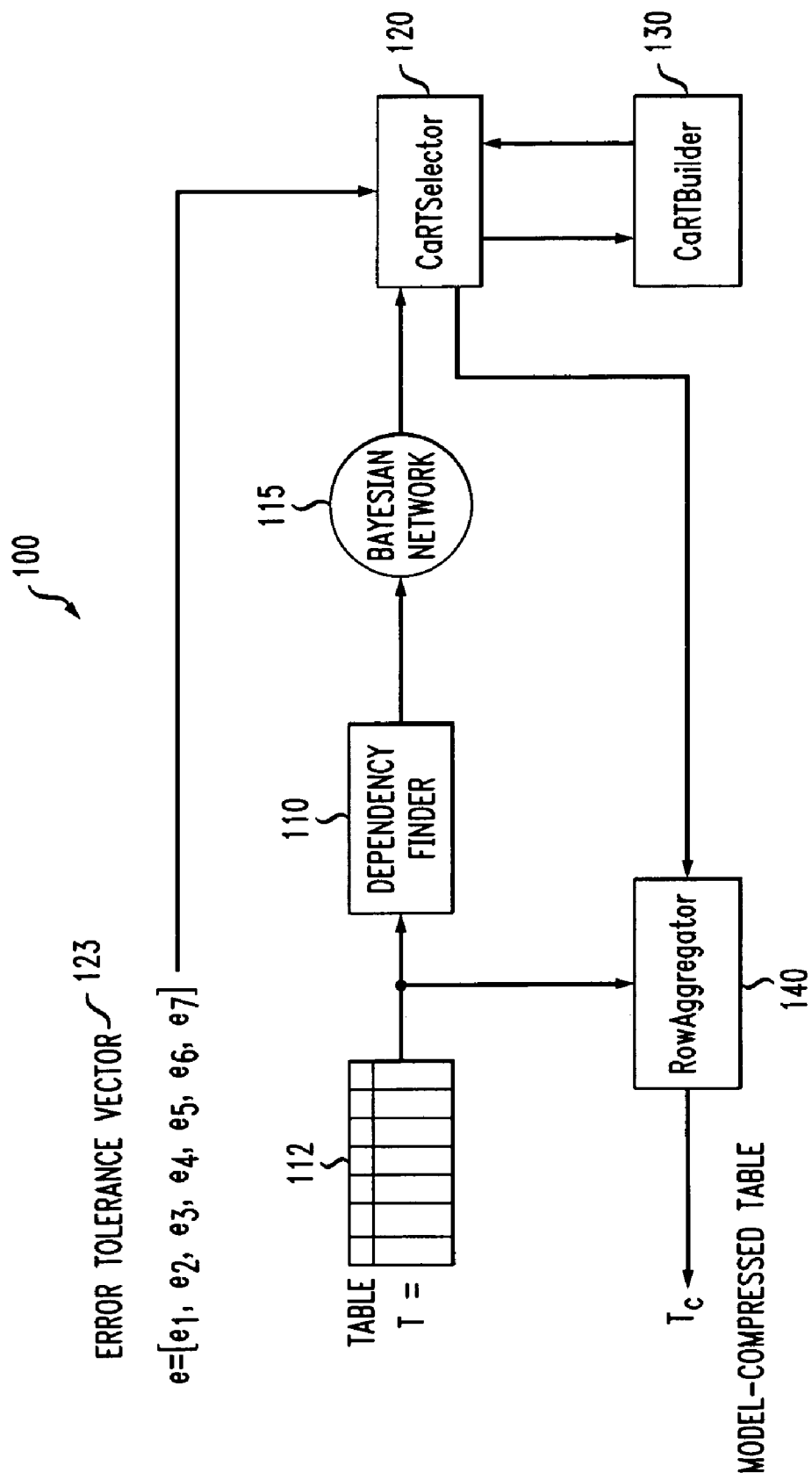
FIG. 1 illustrates an exemplary system for compressing a data table.

Referring initially to FIG. 1, illustrated is a table compressor 100, an embodiment of an exemplary system for compressing a data table according to the principles of the present invention. The table compressor 100 takes advantage of attribute semantics and data-mining models to perform lossy compression of massive data tables. The table compressor 100 is based in part upon a novel idea of exploiting data correlations and user-specified "loss"/error tolerances for individual attributes to construct concise and accurate "Classification and Regression Tree (CaRT)" models for entire columns of a table.

More precisely, the table compressor 100 generally selects a certain subset of attributes (referred to as "predicted" attributes) for which no values are explicitly stored in the compressed table; instead, concise CaRTs that predict these values (within the prescribed error bounds) are maintained. Thus, for a predicted attribute X that is strongly correlated with other attributes in the table, the table compression system 100 is typically able to obtain a very succinct CaRT predictor for the values of X, which can then be used to completely eliminate the column for X in the compressed table. Clearly, storing a compact CaRT model in lieu of millions or billions of actual attribute values can result in substantial savings in storage. In addition, allowing for errors in the attribute values predicted by a CaRT model only serves to reduce the size of the model even further and, thus, improve the quality of compression; this is because, as is well known to those skilled in the art, the size of a CaRT model is typically inversely correlated to the accuracy with which it models a given set of values.

Generally, the table compressor 100 focuses upon optimizing the compression ratio, that is, achieving the maximum possible reduction in the size of the data within the acceptable levels of error defined by the user. This choice is mainly driven by the massive, long-lived data sets that are characteristic of target data warehousing applications and the observation that the computational cost of effective compression can be amortized over the numerous physical operations (e.g., transmissions over a low-bandwidth link)

that will take place during the lifetime of the data. Also, the table compressor 100 can tune compression throughput performance through control of the size of the data sample used by the table compressor's 100 model-construction algorithms and procedures, as will be described in more detail below. Setting the sample size based on the amount of main memory available in the system can help ensure high compression speeds.

A framework for the semantic compression of tables is based upon two technical ideas. First, the (user-specified or application-specified) error bounds on individual attributes are exploited in conjunction with data mining techniques to efficiently build accurate models of the data. Second, the input table is compressed using a select subset of the models built. This select subset of data-mining models is carefully chosen to capture large portions of the input table within the specified error bounds.

More formally, the model-based, compressed version of the input table T may be defined as a pair $T_c = <T', \{M_1, \ldots, M_p\}>$ where (1) T' is a small (possibly empty) subset of the data values in T that are retained accurately in $T_c$; and, (2) $\{M_1, \ldots, M_p\}$ is a select set of data-mining models, carefully built with the purpose of maximizing the degree of compression achieved for T while obeying the specified error-tolerance constraints.

Abstractly, the role of the set T' is to capture values (tuples or sub-tuples) of the original table that cannot be effectively "summarized away" in a compact data-mining model within the specified error tolerances. (Some of these values may in fact be needed as input to the selected models.) The attribute values in T' can either be retained as uncompressed data or be compressed using a conventional lossless algorithm.

A definition of the general model-based semantic compression problem can now be stated as follows.

Model-Based Semantic Compression (MBSC)

Given a massive, multi-attribute table T and a vector of (per-attribute) error tolerances $\bar{e}$, find a collection of models $\{M_1, \ldots, M_m\}$ and a compression scheme for T based on these models $T_c = <T', \{M_1, \ldots, M_p\}>$ such that the specified error bound $\bar{e}$ are not exceeded and the storage requirements $|T_c|$ of the compressed table are minimized.

An input to the table compressor 100 may consist of a n-attribute table T, comprising a large number of tuples (rows). $X = \{X_1, \ldots, X_n\}$ denotes the set of n attributes of T and dom $(X_i)$ represent the domain of attribute $X_i$. Attributes with a discrete, unordered value domain are referred to as "categorical," whereas those with ordered value domains are referred to as "numeric." $T_c$ is used to denote the compressed version of table T, and |T| ($|T_c|$) to denote the storage-space requirements for T ($T_c$) in bytes.

One important input parameter to the semantic compression algorithms of the table compressor 100 is a (user-specified or application-specified) n-dimensional vector of error tolerances $\bar{e} = [e_1, \ldots e_n]$ that defines the per-attribute acceptable degree of information loss when compressing T. (Per-attribute error bounds are also employed in a fascicles framework, to be described in more detail below.) Intuitively, the $i^{th}$ entry of the tolerance vector $e_i$ specifies an upper bound on the error by which any (approximate) value of $X_i$ in the compressed table $T_c$ can differ from its original value in T. Error tolerance semantics can differ across categorical and numeric attributes, due to the very different nature of the two attribute classes.

1. For a numeric attribute $X_i$, the tolerance $e_i$ defines an upper bound on the absolute difference between the actual value of $X_i$ in T and the corresponding (approximate) value in the compressed table $T_c$. That is, if x, x' denote the accurate and approximate value (respectively) of attribute $X_i$ for any tuple of T, then the compressor guarantees that x is in $[x'-e_i, x'+e_i]$.

2. For a categorical attribute $X_i$, the tolerance $e_i$ defines an upper bound on the probability that the (approximate) value of $X_i$ in $T_c$ is different from the actual value in T. More formally, if x, x' denote the accurate and approximate value (respectively) of attribute $X_i$ for any type of T, then the compressor guarantees that $P[x = x'] \geq 1 - e_i$.

For numeric attributes, the error tolerance could very well be specified in terms of quantiles of the overall range of values rather than absolute, constant values. Similarly, for categorical attributes the probability of error could be specified separately for each individual attribute class (i.e., value) rather than an overall measure. (Note that such an extension would, in a sense, make the error bounds for categorical attributes more "local," similar to the numeric case.) The model-based compression framework and algorithms of the present invention can be readily extended to handle these scenarios, so the specific definitions of error tolerance are not central to the present invention. However, for the sake of clarity, the definitions outlined above are used for the two attribute classes. (Note that the error-tolerance semantics can also easily capture lossless compression as a special case, by setting $e_i = 0$ for all i.)

One algorithmic issue faced by the table compressor 100 is that of computing an optimal set of CaRT models for the input table such that (a) the overall storage requirements of the compressed table are minimized, and (b) all predicted attribute values are within the user-specified error bounds. This can be a very challenging optimization problem since, not only is there an exponential number of possible CaRT-based models to choose from, but also building CaRTs (to estimate their compression benefits) is a computation-intensive task, typically requiring multiple passes over the data. As a consequence, the table compressor 100 employs a number of sophisticated techniques from the areas of knowledge discovery and combinatorial optimization in order to efficiently discover a "good" (sub)set of predicted attributes and construct the corresponding CaRT models.

In some practical cases, the use of fascicles can effectively exploit the specified error tolerances to achieve high compression ratios. As alluded to above, a fascicle basically represents a collection of tuples that have approximately matching values for some (but not necessarily all) attributes, where the degree of approximation is specified by user-provided compactness parameters. Essentially, fascicles can be seen as a specific form of data-mining models, i.e., clusters in subspaces of the full attribute space, where the notion of a cluster is based on the acceptable degree of loss during data compression. As stated above, a key idea of fascicle-based semantic compression is to exploit the given error bounds to allow for aggressive grouping and "summarization" of values by clustering multiple rows of the table along several columns (i.e., the dimensionality of the cluster).

There are however, several scenarios for which a more general, model-based compression approach is in order. Fascicles only try to detect "row-wise" patterns, where sets of rows have similar values for several attributes. Such "row-wise" patterns within the given error-bounds can be impossible to find when strong "column-wise" patterns/dependencies (e.g., functional dependencies) exist across attributes of the table. On the other hand, different classes of data-mining models (like Classification and Regression Trees (CaRTs)) can accurately capture and model such correlations and, thereby, attain much better semantic compression in such scenarios.

There is a need for a semantic compression methodology that is more general than simple fascicle-based row clustering in that it can account for and exploit strong dependencies among the attributes of the input table. Data mining, such as the data mining employed by the table compressor 100, offers models (i.e., CaRTs) that can accurately capture such dependencies with very concise data structures. Thus, in contrast to fascicles, the general model-based semantic compression paradigm can accommodate such scenarios.

As alluded to above, row-wise pattern discovery and clustering for semantic compression have been explored in the context of fascicles. In contrast, the table compressor 100 focuses primarily on the novel problems arising from the need to effectively detect and exploit (column-wise) attribute dependencies for the purposes of semantic table compression. One principle underlying the table compressor 100 is that, in many cases, a small classification (regression) tree structure can be used to accurately predict the values of a categorical (resp., numeric) attribute (based on the values of other attributes) for a very large fraction of table rows. This means that for such cases, compression algorithms can completely eliminate the predicted column in favor of a compact predictor (i.e., a classification or regression tree model) and a small set of outlier column values. More formally, the design and architecture of the table compressor 100 focuses mainly on the following concrete MBSC problem.

MBSC Problem Definition: Given a massive, multi-attribute table T with a set of categorical and/or numeric attributes X, and a vector of (per-attribute) error tolerances ê, find a subset $\{X_1, \ldots, X_p\}$ of X and a collection of corresponding CaRT models $\{M1, \ldots, M_p\}$ such that: (1) model $M_i$ is a predictor for the values of attribute $X_1$ based solely on attributes in $X^-\{X1, \ldots, X_p\}$, for each I=1, ..., p; (2) the specified error bounds ê are not exceeded; and (3) the storage requirements $[T_c]$ of the compressed table $T_c = <T^1, \{M_1, \ldots, M_p\}>$ are minimized.

Abstractly, the semantic compression algorithms seek to partition the set of input attributes X into a set of predicted attributes $\{X_1, \ldots, X_p\}$ and a set of predictor attributes $X-\{X_1, \ldots, X_p\}$ such that the values of each predicted attribute can be obtained within the specified error bounds based on (a subset of) the predictor attributes through a small classification or regression tree (except perhaps for a small set of outlier values). (The notation $X_i \rightarrow X_i$ is used to denote a CaRT predictor for attribute $X_i$ using the set of predictor attributes $X_i-\{X_1, \ldots, X_p\}$.) Note that we do not allow a predicted attribute $X_i$ to also be a predictor for a different attribute. This restriction is important since predicted values of $X_i$ can contain errors, and these errors can cascade further if the erroneous predicated values are used as predictors, ultimately causing error constraints to be violated. The final goal, of course, is to minimize the overall storage cost of the compressed table. This storage cost $[T_c]$ is the sum of two basic components:

1. Materialization cost, i.e., the cost of storing the values for all predictor attributes $X-\{X_1, \ldots, X_p\}$. This cost is represented in the $T^1$ component of the compressed table, which is basically the projection of T onto the set of predictor attributes. (The storage cost of materializing attribute $X_1$ is denoted by a procedure MaterCost $(X_i)$.)
2. Prediction Cost, i.e. the cost of storing the CaRT models used for prediction plus (possibly) a small set of outlier values of the predicted attribute for each model. (The storage cost of predicting attribute $X_i$ through the CaRT predictor $X_i \rightarrow X_i$ is denoted by a procedure PredCost $(X_i \rightarrow X_i)$; note that this does not include the cost of materializing the predictor attributes in $X_i$.)

Metrics

The basic metric used to compare the performance of different compression algorithms and the table compressor 100 is the well-known compression ratio, defined as the ratio of the size of the compressed data representation produced by the algorithm and the size of the original (uncompressed) input. A secondary performance metric is the compression throughput that, intuitively, corresponds to the rate at which a compression algorithm can process data from its input; this is typically defined as the size of the uncompressed input divided by the total compression time.

Turning once again to FIG. 1, disclosed is one embodiment of the table compressor 100 that includes four major functional blocks: a DependencyFinder 110, a CaRTSelector 120, a CaRTBuilder 130 and a RowAggregator 140. In the following paragraphs, a brief overview of each functional block is provided; a more detailed description of each functional block and the relevant algorithms are discussed more fully below.

Generally, the DependencyFinder 110 produces a mathematical model, also known as an interaction model, using attributes of a data table 112. The data output of the interaction model are then used to guide CaRT building algorithms, such as those used by the CaRTSelector 120 and the CaRTBuilder 130. The DependencyFinder 110 builds this interaction model in part because there are an exponential number of possibilities for building CaRT-based attribute predictors, and therefore a concise model that identifies the strongest correlations and "predictive" relationships in input data is needed. To help determine these correlations and "predictive" relationships in input data, an approach used by the DependencyFinder 110 is to construct a Bayesian network 115 model that captures the statistical interaction of an underlying set of attributes X.

A Bayesian network is a DAG whose edges reflect strong predictive correlations between nodes of the graph. Thus, a Bayesian network 115 on the table's attributes can be used to dramatically reduce the search space of potential CaRT models since, for any attribute, the most promising CaRT predictors are the ones that involve attributes in its "neighborhood" in the network. An implementation employed by the DependencyFinder 110 uses a constraint-based Bayesian network builder based on recently proposed algorithms for efficiently inferring the Bayesian network 115 from data. To control the computational overhead, the Bayesian network 115 may be built using a reasonably small random sample of the input table. Thus, intuitively, a set of nodes in the "neighborhood" of X, in G (e.g., $X_i$'s parents) captures the attributes that are strongly correlated to $X_i$ and, therefore, show promise as possible predictor attributes for $X_i$.

After the Bayesian network 115, has been built, the CaRTSelector 120 will then be executed. Given the input table T 112 and error tolerances $e_i$ 123, (as well as the Bayesian network 115 on the attributes of T built by the DependencyFinder 110,) the CaRTSelector 120 is generally responsible for selecting a collection of predicted attributes and the corresponding CaRT-based predictors such that a final overall storage cost is minimized (within the given error bounds). The CaRTSelector 120 employs the Bayesian network 115 built on X to intelligently guide a search through the huge space of possible attribute prediction strategies. Clearly, this search involves repeated interactions with CaRTBuilder 130 which is responsible for actually building the CaRT-models for the predictors.

However, even in the simple case where the set of nodes that is used to predict an attribute node in the Bayesian network 115, is fixed, the problem of selecting a set of predictors by the CaRTSelector 120 that minimizes the combination of materialization and prediction cost naturally maps to the Weighted Maximum Independent Set (WMIS) problem, which is known to be NP-hard and therefore notoriously difficult to approximate.

Based on this observation, a specific CaRT-model selection strategy is therefore employed by the CaRTSelector 120. This selection strategy starts out with an initial solution obtained from a near-optimal heuristic for WMIS and then tries to incrementally improve it by small perturbations based on unique characteristics of the given variables. In an alternative embodiment of the present invention, a procedure "greedy" ( ) model-selection algorithm used by the CaRTSelector 120 chooses its set of predictors using a simple local condition during a single "roots-to-leaves" traversal of the Bayesian network 115, also referred to in the present application as a Bayesian network G. During the execution of the CaRTSelector 120, the CaRTBuilder 130 is repeatedly invoked and executed to build CaRT models for the predictors.

A significant portion of the table compressor 100 execution time is spent in building CaRT models. This is mainly because the table compressor 100 needs to actually construct many promising CaRTs in order to estimate their prediction cost, and CaRT construction is a computationally-intensive process. To reduce CaRT-building times and speed up system performance, the table compressor 100 employs the following three optimizations: (1) CaRTs may be built using random samples instead of the entire data set, (2) leaves may not be expanded if values of tuples in them can be predicted with acceptable accuracy, and (3) pruning is integrated into the tree growing phase using novel algorithms that exploit the prescribed error tolerance for the predicted attribute. These optimizations will be explained in more detail, below.

Given a collection of predicted and (corresponding) predictor attributes $X_i \rightarrow X_j$, one goal of the CaRTBuilder 130 is to efficiently construct CaRT-based models for each $X_i$ in terms of $X_j$ for the purposes of semantic compression. Induction of various CaRT-based models by the CaRTBuilder 130 is typically a computation-intensive process that requires multiple passes over the input data. As is demonstrated, however, the CaRT-construction algorithms of the CaRTBuilder 130 can take advantage of compression semantics and can exploit the user-defined error-tolerances to effectively prune computation. In addition, by building CaRTs using data samples instead of the entire data set, the CaRTBuilder 130 is able to further speed up model construction.

The CaRTBuilder 130 exploits the inferred Bayesian network structure G by using it to intelligently guide the selection of CaRT models that minimize the overall storage requirement, based on the prediction and materialization costs for each attribute. Intuitively, the goal is to minimize the sum of the prediction costs (for predicted attributes) and materialization costs (for attributes used in the CaRTs). This model-selection problem is a strict generalization of the Weighted Maximum Independent Set (WMIS) problem which is known by those skilled in the art to be NP-hard. By employing a novel algorithm (detailed below) that effectively exploits the discovered Bayesian structure in conjunction with efficient, near optimal WMIS heuristics, the CaRTBuilder 130 is able to obtain a good set of CaRT models for compressing the table.

Once the CaRTSelector 120 has finalized a "good" solution to the CaRT-based semantic compression problem based off of computations performed by the CaRTBuilder 130, the CaRTSelector 120 then hands off its solution to the RowAggregator 140. The RowAggregator 140 tries to further improve a compression ratio through row-wise clustering. Briefly, the RowAggregator 140 uses a fascicle-based algorithm to compress the predictor attributes while ensuring (based on the CaRT models built) that errors in the predictor attribute values are not propagated through the CaRTs in a way that causes error tolerances (for predicted attributes) to be exceeded.

One important point here is that, since the entries of $T_1$ are used as inputs to (approximate) CaRT models for other attributes, care must be taken to ensure that errors introduced in the compression of $T^1$ do not compound over the CaRT models in a way that causes error guarantees to be violated. The issues involved in combining the CaRT-based compression methodology with row-wise clustering techniques are addressed in more detail below.

The CaRT-based compression methodology of the table compressor 100 is essentially orthogonal to techniques based on row-wise clustering, such as fascicles. It is entirely possible to combine the two techniques for an even more effective model-based semantic compression mechanism. As an example, the predictor attribute table $T^1$ derived by the "column-wise" techniques can be compressed using a fascicle-based algorithm. (In fact, this is exactly the strategy used in the table compressor 100 implementation; however, other methods for combining the two are also possible.)

To reiterate, the essence of the CaRT-based semantic compression problem of the table compressor 100 of FIG. 1 lies in discovering a collection of "strong" predictive correlations among the attributes of an arbitrary table. The search space for this problem is obviously exponential: given any attribute $X_i$, any subset of $X-\{X_i\}$ could potentially be used to construct a predictor for $X_i$. Furthermore, verifying the quality of a predictor for the purposes of semantic compression is typically a computation-intensive task, since it involves actually building the corresponding classification or regression tree on the given subset of attributes. Since building an exponentially large number of CaRTs is clearly impractical, a methodology is disclosed for producing a concise interaction model that identifies the strongest predictive correlations among the input attributes. This model can then be used to restrict the search to interesting regions of the prediction space, limiting CaRT construction to truly promising predictors. Building such an interaction model is one main purpose of the DependencyFinder 110.

As stated previously, the specific class of attribute interaction models used in the table compressor 100 may be that of Bayesian networks. To reiterate, a Bayesian network is a combination of a probability distribution and a structural model in the form of a DAG over the attributes in which edges represent direct probabilistic dependence. In effect, a Bayesian network is a graphical specification of a joint probability distribution that is believed to have generated the observed data. Bayesian networks may be an essential tool for capturing causal and/or predictive correlations in observational data; such interpretations are typically based on the following dependence semantics of the Bayesian network structure:

Parental Markov Condition: Given a Bayesian network G over a set of attributes X, and node $X_i \epsilon X$ is independent of all its non-descendant nodes given its parent nodes in G (denoted by $\Pi(X_i)$).

Markov Blanket Condition: Given a Bayesian network G over a set of attributes X, the Markov blanket of $X_i \epsilon X$ (denoted by $\beta(X_i)$) is defined as the union of $X_i$'s children, and the parents of $X_i$'s children in G. Any node $X_i \epsilon X$ is independent of all other nodes given its Markov blanket in G.

Based on the above conditions, a Bayesian network over the attributes of the input table can provide definite guidance on the search for promising CaRT predictors for semantic compression. More specifically, it is clear that predictors of the form $\Pi(X_i) \rightarrow X_i$ or $\beta(X_i) \rightarrow X_i$ should be considered as prime candidates for CaRT-based semantic compression.

Construction Algorithm

Learning the structure of Bayesian networks from data is a difficult problem that has seen growing research interest in recent years. There are two general approaches to discovering Bayesian structure: (1) Constraint-based methods try to discover conditional independence properties between data attributes using appropriate statistical measures (e.g., $X^2$ or mutual information) and then build a network that exhibits the observed correlations and independencies. (2) Scoring-based (or Bayesian) methods are based on defining a statistically-motivated score function (e.g., Bayesian or MDL-based) that describes the fitness of a probabilistic network structure to the observed data; the goal then is to find a structure that maximizes the score. (In general, this is a hard optimization problem that is typically NP-hard.)

The methods have different advantages. Given the intractability of scoring-based network generation, several heuristic search methods with reasonable time complexities have been proposed. Many of these scoring-based methods, however, assume an ordering for the input attributes and can give drastically different networks for different attribute orders. Further, due to their heuristic nature, such heuristic methods may not find the best structure for the data.

On the other hand, constraint-based methods have been shown to be asymptotically correct under certain assumptions about the data, but, typically, introduce edges in the network based on Conditional Independence (CI) tests that become increasingly expensive and unreliable as the size of the conditioning set increases. Also, several constraint-based methods have very high computational complexity, requiring, in the worst case, an exponential number of CI tests.

The DependencyFinder 110

The DependencyFinder 110 may implement a constraining-based Bayesian network builder, such as one based upon the algorithm of Cheng et al. in "Learning Belief Networks from Data: An Information Theory Based Approach" published in the November 1997 issue of the *Proceedings of the Sixth International Conference on Information and Knowledge Management* which in hereby incorporated by reference in its entirety. Unlike earlier constraint-based methods, the algorithm of Cheng, et al., explicitly tries to avoid complex CI tests with large conditioning sets and, by using CI tests based on mutual information divergence, eliminates the need for an exponential number of CI tests. In fact, given an n-attribute data set, the Bayesian network builder of the table compressor 100 requires at most $O(n^4)$ CI tests, which, in the present implementation, translates to at most $O(n^4)$ passes over the input tuples. Recall that the Dependency-Finder 110 uses only a small random sample of the input table to discover the attribute interactions; the size of this sample can be adjusted according to the amount of main memory available, so that no I/O is incurred (other than that required to produce the sample).

Also, note that the DependencyFinder 110 is, in a sense, out of the "critical path" of the data compression process, since such attribute interactions are an intrinsic characteristic of the data semantics that only needs to be discovered once for each input table. The DependencyFinder 110 adds several enhancements to the basic Cheng et al. algorithm, such as the use of Bayesian-scoring methods for appropriately orienting the edges in the final network.

The CaRTSelector 120

The CaRTSelector 120 is an integral part of the table compressor 100 model-based semantic compression engine. Given the input data table and error tolerances, as well as the Bayesian network capturing the attribute interactions, a goal of the CaRTSelector 120 is to select (a) a subset of attributes to be predicted and (2) the corresponding CaRT-based predictors, such that the overall storage cost is minimized within the specified error bounds. As discussed above, the total storage cost $T_c$ is the sum of the materialization costs (of predictor attributes) and prediction costs (of the CaRTs for predicted attributes). In essence, the CaRTSelector 120 implements the core algorithmic strategies for solving the CaRT-based semantic compression problem. Deciding on a storage-optimal set of predicted attributes and corresponding predictors poses a hard combinatorial optimization problem; as the following theorem shows, the problem is NP-hard even in the simple case where the set of predictor attributes to be used for each attribute is fixed, as expressed in the following theorem.

Theorem 1: Consider a given set of n predictors $\{X_i \rightarrow X_i:$ for all $X_i \epsilon X$, where $X_i \subseteq X\}$. Choosing a storage-optimal subset of attributes $X_{pred} \subseteq X$ to be predicted using attributes in $X-X_{pred}$ is NP-hard.

Interestingly, the simple instance of the CaRT-based semantic compression problem of the table compressor 100 described in the above theorem can be shown to be equivalent to the Weighted Maximum Independent Set (WMIS) problem, which is known to be NP-hard. The WMIS problem can be stated as follows: "Given a node-weighted, undirected graph G=(V,E), find a subset of nodes V' $\subseteq$ V such that no two vertices in V' are joined by an edge in E and the total weight of nodes in V' is maximized." Abstractly, the partitioning of the nodes into V' and V–V' corresponds exactly to the partitioning of attributes into "predicted" and "materialized" with the edges of G capturing the "predicted by" relation. Further, the constraint that no two vertices in V' are adjacent in G ensures that all the (predictor) attributes for a predicted attribute (in V') are materialized, which is a requirement of the compression problem of the table compressor 100. Also, the weight of each node corresponds to the "storage benefit" (materialization cost–prediction cost) of predicting the corresponding attribute. Thus, maximizing the storage benefit of the predicted attributes has the same effect as minimizing the overall storage cost of the compressed table.

Even though WMIS is known to be NP-hard and notoriously difficult to approximate for general graphs, several recent approximation algorithms have been proposed with guaranteed worst-case performance bounds for bounded-degree graphs. The optimization problem faced by the CaRTSelector 120 is obviously much harder than simple WMIS, since the CaRTSelector 120 is essentially free to decide on the set of predictor attributes for each CaRT. Further, the CaRTSelector 120 also has to invoke the CaRT- Builder 130 to actually build potentially useful CaRTs, and this construction is itself a computation-intensive task.

Given the inherent difficulty of the CaRT-based semantic compression problem, the CaRTSelector 120 implements two distinct heuristic search strategies that employ the Bayesian network model of T built by the Dependency-Finder 110 to intelligently guide the search through the huge space of possible attribute prediction alternatives. The first strategy is a simple "greedy" selection algorithm that chooses CaRT predictors greedily based on their storage benefits during a single "roots-to-leaves" traversal of the Bayesian graph. The second, more complex strategy takes a less myopic approach that exploits the similarities between the CaRT-selection problem and WMIS; a key idea here is to determine the set of predicted attributes (and the corresponding CaRTs) by obtaining (approximate) solutions to a number of WMIS instances created based on the Bayesian model of T.

The Greedy CaRT Selector

Turning now to FIG. 2, illustrated is one embodiment of the procedure greedy ( ), a CaRT-selection algorithm, which may be implemented within the CaRTSelector 120. Briefly, the greedy algorithm visits the set of attributes X in the topological-sort order imposed by the constructed Bayesian network model G and tries to build a CaRT predictor for each attribute based on its predecessors. Thus, for each attribute $X_i$ visited, there are two possible scenarios.

1. If $X_i$ has no parent nodes in G (i.e., node $X_i$ is a root of G) then Greedy concludes that $X_i$ cannot be predicted and, consequently, places $X_i$ directly in the subset of materialized attributes $X_{mat}$ (Step 4).
2. Otherwise (i.e., $\Pi(X_i)$ is not empty in G), the CaRT-Builder 130 component is invoked to construct a CaRT-based predictor for $X_i$ (within the specified error tolerance $e_i$) using the set of attributes chosen for materialization thus far $X_{mat}$ (Step 6). (Note that possibly irrelevant attributes in $X_{mat}$ will be filtered out by the CaRT construction algorithm in CaRTBuilder 130.) Once the CaRT for $X_i$ is built, the relative cost of predicting $X_i$ is estimated and $X_i$ chosen (Steps 7–8).

The greedy algorithm provides a simple, low-complexity solution to the CaRT-based semantic compression problem of the table compressor 100. Given an attribute table and Bayesian network G, it is easy to see that greedy always constructs at most (n−1) CaRT predictors during its traversal of G. This simplicity, however, comes at a price.

More specifically, greedy CaRT selection suffers from two shortcomings. First, selecting an attribute $X_i$ to be predicted based solely on its "localized" prediction benefit (through its predecessors in G) is a very myopic strategy, since it ignores the potential benefits from using $X_i$ itself as a (materialized) predictor attribute for its descendants in G. Such very localized decisions can obviously result in poor overall predictor selections. Second, the value of the "benefit threshold" parameter θ can adversely impact the performance of the compression engine and selecting a reasonable value for θ is not a simple task. A high θ value may mean that very few or no predictors are chosen, whereas a low θ value may cause low-benefit predictors to be chosen early in the search thus excluding some high-benefit predictors at lower layers of the Bayesian network.

EXAMPLE 1

Turning now to FIGS. 3A–3D, consider the Bayesian network graph defined over attributes $X_1, \ldots, X_4$. Let the materialization cost of each attribute be 125. Further, let the prediction costs of CaRT predictors be as follows:

PredCost($\{X_1\} \to X_2$)=75  PredCost($\{X_1\} \to X_3$)=80

PredCost($\{X_1\} \to X_4$)=125  PredCost($\{X_2\} \to X_3$)=15

PredCost($\{X_2\} \to X_4$)=80  PredCost($\{X_3\} \to X_4$)=75

Suppose that θ=1.5. Since $X_1$ has no parents, it is initially added to $X_{mat}$ (Step 4). In the next two iterations, since MaterCost ($X_2$)/PredCost ($\{X_1\} \to X_2$)=1.67>1.5 and MaterCost ($X_3$)/PredCost ($\{X_1\} \to X_3$)=1.56>1.5, $X_2$ and $X_3$ are added to $X_{pred}$ (Step 7). Finally, $X_4$ is added to $X_{mat}$ since MaterCost ($X_4$)/PredCost ($\{X_1\} \to X_4$)=1<1.5. Thus, the overall storage cost of materializing $X_1$ and $X_4$, and predicting $X_2$ and $X_3$ is 125+75+80+125=405.

The MaxIndependentSet CaRT Selector

Turning now to FIG. 4, depicted is one embodiment of a procedure MaxIndependentSet ( ) CaRT-selection algorithm which alleviates some drawbacks of the greedy algorithm mentioned above. Intuitively, the MaxIndependentSet algorithm starts out by assuming all attributes to the materialized, i.e., $X_{mat}$=X (Step 1), and then works by iteratively solving WMIS instances that try to improve the overall storage cost by moving the nodes in the (approximate) WMIS solution to the subset of predicted attributes $X_{pred}$.

Consider the first iteration of a main while-loop (Steps 3–30). The algorithm MaxIndependentSet starts out by building CaRT-based predictors for each attribute $X_i$ in X based on $X_i$'s "predictive neighborhood" in the constructed Bayesian network G (Steps 5–7); this neighborhood function is an input parameter to the algorithm and can be set to either $X_i$'s parents or its Markov blanket in G. Then, based on the "predicted-by" relations observed in the constructed CaRTs, the algorithm MaxIndependentSet builds a node-weighted, undirected graph $G_{temp}$ on X with (a) all edges ($X_i$, Y), where Y is used in the CaRT predictor for $X_i$ and (b) waits for each node $X_i$ set equal to the storage cost-benefit of predicting $X_i$. (Steps 16–20). Finally, the algorithm MaxIndependentSet finds a (near-optimal) WMIS of $G_{temp}$ and the corresponding nodes/attributes are moved to the predicted set $X_{pred}$ with the appropriate CaRT predictors (assuming the total benefit of the WMIS is positive) (Steps 21–29).

Note that in Step 5, it is possible for mater neighbors ($X_i$) to be φ. This could happen, for instance, if $X_i$ is a root of G and $X_i$'s neighborhood comprises of its parents. In this case, the model M returned by a subprogram BuildCaRT is empty and it does not make sense for $X_i$ to be in the predicted set $X_{pred}$. $X_i$ should always stays in $X_{mat}$ by setting PredCost (PRED($X_i$)→$X_i$) to ∞ if PRED ($X_i$)=φ, which causes $X_i$'s weight to become −∞ in Step 20.

The WMIS solution calculated after this first iteration of the Algorithm MaxIndependentSet can be further optimized, since it makes the rather restrictive assumption that an attribute can only be predicted based on its direct neighborhood in G. For example, consider a scenario where G contains the directed chain $\{X,Y\} \to Z \to W$, and the attribute pair $\{X,Y\}$ provides a very good predictor for Z, which itself is a good predictor for the value of W. Then, the initial WMIS solution can obviously select only one of these predictors. On the other hand, the above scenario means that (by "transitivity") it is very likely that $\{X,Y\}$ can also provide a good predictor for W (i.e., only X and Y need to be materialized).

Later iterations of the algorithm MaxIndependentSet's main while-loop try to further optimize the initial WMIS solution based on the above observation. This is accomplished by repeatedly moving attributes from the remaining set of materialized attributes $X_{mat}$ to the predicted attributes $X_{pred}$. For each materialized attribute $X_1$, MaxIndependentSet finds its "materialized neighborhood" in the Bayesian model G, that comprises for each node X in the neighborhood of $X_i$: (1) X itself, if X ∈ $X_{mat}$ and (2) the (materialized) attributes currently used to predict X, if X ∈ $X_{pred}$ (Step 5). A CaRT predictor for $X_i$ based on its materialized neighbors is then constructed (Step 6). Now, since $X_i$ may already be used in a number of predictors for attributes in $X_{pred}$, the change in storage cost for these predictors needs to be accounted for when $X_i$ is replaced by its materialized neighbors used to predict it; this change (denoted by cost change$_i$) is estimated in Steps 8–14.

The node-weighted, undirected graph $G_{temp}$ is then built on $X_{mat}$ with the weight for each node $X_i$ set equal to the overall storage benefit of predicting $X_i$, including cost_change$_i$ (Steps 16–20). (Note that this benefit may very well be negative.) Finally, a (near-optimal) WMIS of $G_{temp}$ is chosen and added to the set of predicted attributes $X_{pred}$ with the appropriate updates to the set of CaRT predictors. Note that, since the MaxIndependentSet algorithm considers the "transitive effects" of predicting each materialized node $X_i$ in isolation, some additional care has to be taken to ensure that at most one predictor attribute from each already selected CaRT in $X_{pred}$ is chosen at each iteration. This is accomplished by ensuring that all attributes belonging to a predictor set PRED ($X_j$) for some $X_j$ ∈ $X_{pred}$ form a clique in the construction of $G_{temp}$ (Step 18). Then, by its definition, the WMIS solution can contain at most one node from each such set PRED ($X_j$). MaxIndependentSet's while-loop continues until no further improvements on the overall storage cost are possible (Step 23).

EXAMPLE 2

Figure 3A:
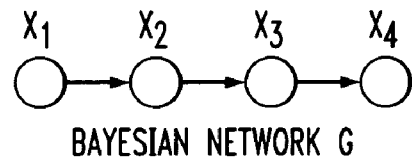
FIGS. 3A–3D illustrates a Bayesian network graph defined over attributes $X_1, \ldots, X_4$.
Figure 3B:
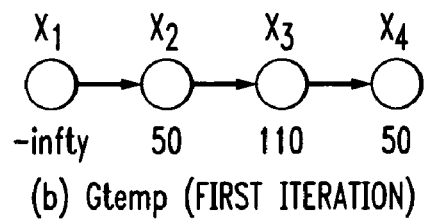

Turning back to FIGS. 3A–3D, consider the Bayesian network graph shown in FIG. 3A and let prediction costs for attributes be as described earlier in Example 3.1. Further, suppose the neighborhood function for a node $X_i$ is its parents. In the first iteration, PRED ($X_1$)=φ, PRED ($X_2$)=$X_1$, PRED ($X_3$)=$X_2$ and PRED ($X_4$)=$X_3$. Further, since $X_{pred}$=φ, cost_change$_1$=0 for each $X_i$ ∈ $X_{mat}$. As a result, the graph $G_{temp}$ and weights for the nodes are set as shown in FIG. 3B. Note that node $X_1$ is assigned a weight of –∞ because PRED ($X_1$)=φ. The optimal WMIS of $G_{temp}$ is {$X_3$} since its weight is greater than the sum of the weights of $X_2$ and $X_4$. Thus, after the first iteration $X_{pred}$={$X_3$}.

Figure 3C:
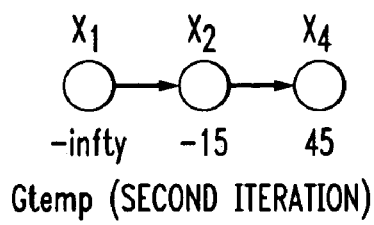

In the second iteration, PRED ($X_4$) is set to $X_2$ in Steps 5–7 since neighborhood ($X_4$)=$X_3$ and $X_3$ ∈ $X_{pred}$ with PRED ($X_3$)=$X_2$. Further, PRED($X_1$)=φ and PRED ($X_2$)=$X_1$. Also, since $X_2$ ∈ PRED($X_3$), in Steps 8–14, NEW_PRED$_2$ ($X_3$) ={$X_1$} and cost change$_2$=PredCost ({$X_2$}→$X_3$) PredCost ({$X_1$}→$X_3$)=–65. In addition, since $X_1$ and $X_4$ are not predictors for a predicted attribute, cost_change$_1$=cost_change$_4$=0. Thus, the graph $G_{temp}$ and weights for the nodes are set as shown in FIG. 3C. The weight for $X_2$ is essentially MaterCost ($X_2$)–PredCost ({$X_1$}→$X_2$)+cost_change$_2$=125–75–65 and the weight for $X_4$ is MaterCost ($X_4$)–PredCost ({$X_2$}→$X_4$)+cost+ change$_4$=125–80+0. The optimal WMIS of $G_{temp}$ is {$X_4$} and thus $X_{pred}$={$X_3$, $X_4$} after the second iteration.

Figure 3D:
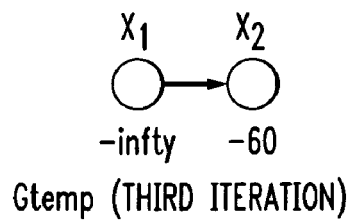

Finally, FIG. 3D illustrates $G_{temp}$ during the third iteration—node $X_2$ has a weight of –60 since PRED ($X_2$)={$X_1$} and $X_2$ is used to predict both $X_3$ and $X_4$. Thus, while predicting (instead of materializing) $X_2$ results in a decrease of 50 in the cost of $X_2$, the cost of predicting $X_3$ and $X_4$ using $X_1$ (instead of $X_2$) increases by 110, thus resulting in a net increase in cost of 60. The algorithm terminates since weight of every node in $G_{temp}$ is negative. The end result is a total storage cost of only 345, which is, in fact, the optimal solution for this instance.

Complexity of Algorithm MaxIndependentSet

Analyzing the execution of algorithm MaxIndependentSet, it can be shown that, in the worst case, it requires at most O(n) invocations of the WMIS solution heuristic, such as a subprocedure "FindWMIS" disclosed within FIG. 4, and constructs at most $pn^2/2$ CaRT predictors, where n is the number of attributes in X and p is an upper bound on the number of predictor attributes used for any attribute in $X_{pred}$.

These upper bounds on the execution-time complexity of algorithm MaxIndependentSet are very pessimistic, since they are based on the assumption that only a single attribute is moved from $X_{mat}$ to $X_{pred}$ during each iteration of the main while-loop (Steps 3–30). That is, the maximum weight independent set S computed in Step 21 always contains just one node of $G_{temp}$.

A perhaps more realistic situation is to assume that each independent set found by the procedure FindWMIS represents (on the average) a constant fraction (e.g., 20%) of the nodes in $G_{temp}$. Under this assumption, it can be shown that the MaxIndependentSet algorithm only needs to solve O( log n) WMIS instances and build O (pn log n) CaRT predictors. Finally, in practice, the actual running time of the MaxIndependentSet algorithm can be further reduced by requiring that the storage cost improvement attained during each while-loop (i.e., the weight( ) of the WMIS found) be above a certain threshold.

The CaRTBuilder 130

The CaRTBuilder 130 constructs a CaRT predictor $X_i$→$X_i$ for the attribute $X_i$ with $X_i$ as the predictor attributes. An objective of the CaRTBuilder 130 is to construct the smallest (in terms of storage space) CaRT model such that each predicted value (of a tuple's value for attribute $X_i$) deviates from the actual value by at most $e_i$, the error tolerance for attribute $X_i$.

If the predicted attribute $X_i$ is categorical, then the CaRTBuilder 130 builds a compact classification tree with values of $X_i$ serving as class labels. The CaRTBuilder 130 employs classification tree construction algorithms, such as those described in "PUBLIC: A Decision Tree Classifier that Interates Building and Pruning" by Rastogi, et al., published by *Proceedings of the 24th International Conference on Very Large Data Bases*, New York, 1998, and "SPRINT: A Scalable Parallel Classifier for Data Mining" by Shafer et al., published by *Proceedings of the 22nd International Conference on Very Large Data Bases*, Bombay, India, 1996 which are both hereby incorporated by reference in their entirety. These or analogous algorithms are first used to construct a low storage cost tree and then explicitly stores sufficient number of outliers such that the fraction of misclassified records is less than the specified error bound $e_i$. Thus, the CaRTBuilder 130 guarantees that the fraction of attributes $X_i$'s values that are incorrectly predicted is less than $e_i$.

Storage Cost of Regression Trees

A regression tree consists of two types of nodes—internal nodes and leaves. Each internal node is labeled with a splitting condition involving attribute $X_j$ ∈ $X_i$—this condition is of the form $X_j$>x if $X_j$ is a numeric attribute and $X_j$ ∈ {x, x', . . . } if $X_j$ is categorical. Each leaf is labeled with a numeric value x which is the predicted value for $X_i$ for all tuples in table T that belong to the leaf (a tuple belongs to a leaf if it satisfies the sequence of splitting conditions on the path from the root to the leaf). Thus, for a tuple t belonging to a leaf with label x, the predicted value of t on attribute $X_i$, $t[X_i]$ satisfies the error bounds if $t[X_i] \in [x-e_i,x+e_i]$. Tuples t in the leaf for whom $t[X_i]$ lies outside the range $[x-e_i,x+e_i]$ are outliers since their predicted values differ from their actual values by more than the tolerance limit.

The storage cost of a regression tree R for predicting $X_i$ thus may consist of (1) the cost of encoding nodes of the tree and their associated labels, and (2) the cost of encoding outliers. The cost of encoding an internal node N of the tree is $1+\log|X_1|+C_{split}(N)$, where 1 bit is needed to specify the type of node (internal or leaf), $\log|X_i|$ is the number of bits to specify the splitting attribute and $C_{split}(N)$ is the cost of encoding the split value for node N. If v is the number of distinct values for the splitting attribute $X_j$ at node N, then $C_{split}(N)=\log(v-1)$ if $X_j$ is numeric and $=\log(2^v-2)$ if $X_j$ is categorical.

Next, the cost of encoding a leaf with label x is computed. Due to Shannon's theorem, in general, the number of bits required to store m values of attribute $X_i$ is m times the entropy of $X_i$. Since $X_i$ is a numeric attribute, $\log|dom(X_i)|$ is a good approximation for the entropy of $X_i$. Thus, to encode a leaf node N, $1+\log(|dom(X_i)|)$ bits are needed, where 1 bit is needed to encode the node type for the leaf and $\log(|dom(X_i)|)$ bits are used to encode the label. Finally, if the leaf contains m outliers, then these need to be encoded separately at a total cost of approximately $m \log(|dom(X_i)|)$. Efficient algorithms for computing a low-cost regression tree that predicts $X_i$ are presented below.

Regression Tree Construction with Separate Building and Pruning

A low-cost regression tree in two phases is constructed in two phases—a tree building phase followed by a tree pruning phase. At the start of the building phase, the tree contains a single root node containing all the tuples in T. The tree building procedure continues to split each leaf N in the tree until for tuples t in the leaf, the difference between the maximum and minimum values of $t[X_i]$ is less than or equal to $2e_i$. The splitting condition for a node N containing a set of tuples S is chosen such that the mean square error of the two sets of tuples due to the split is minimized. Thus, if the split partitions S into two sets of tuples $S_1$ and $S_2$, then $\Sigma^{TeS1}(t[X_i]-u_1)^2+\Sigma_{TeS1}(t[X_i]-u_2)^2$ is minimized, where $u_1$ and $u_2$ are the means of $t[X_i]$ for tuples t in $S_1$ and $S_2$, respectively.

At the end of the tree building phase, for each leaf N of the constructed tree R, the label x is set to $(t_{min}[X_i]+t_{max}[X_i])/2$, where $t_{min}$ and $t_{max}$ are the tuples in N with the minimum and maximum values for $X_i$. Thus, R contains no outliers since $(t_{min}[X_i]-t_{max}[X_i]) \leq 2e_i$ and as a result, the error in the predicted values of attribute $X_i$ are within the permissible limit. However, the cost of R may not be minimum—specifically, deleting nodes from R may actually result in a tree with smaller storage cost. This is because while pruning an entire subtree from R may introduce outliers whose values need to be stored explicitly, the cost of explicitly encoding outliers may be much smaller than the cost of the deleted subtree.

Thus, one goal of the pruning phase is to find the subtree of R (with the same root as R) with the minimum cost. Consider an internal node N in R and let S be the set of tuples in N. Let $R_N$ be the subtree of R rooted at node N with cost $C(R_N)$ (the cost of encoding nodes and outliers in $R_N$). Thus, $C(R_N)$ is essentially the reduction in the cost of R if N's children are deleted from R. Now, deletion of N's children from R causes N to become a leaf whose new cost is as follows. Suppose that x is the label value for N that minimizes the number, say m, of outliers. Then the new cost of leaf N, $C(N)=1+\log(|dom(X_1)|)+m \log(|dom(X_i)|)$. Thus, if $C(N) \leq C(R_N)$ for node N, then deleting N's children from R causes R's cost to decrease.

The overall pruning algorithm for computing the minimum cost subtree of R considers the nodes N in R in decreasing order of their distance from the root of R. If, for a node N, $C(N) \leq C(R_N)$, then its children are deleted from R.

One issue that needs to be resolved when computing C(N) for a node N is determining the label x for N that minimizes the number, m, of outliers. However, this resolution can easily be achieved by maintaining for each node N, a sorted list containing the $X_i$ values of tuples in N. Then, in a single pass over the list, for each value x' in the list, it is possible to compute the number of elements (in the list) that fall in the window. $[x', x'+2e_i]$ If x' is the value for which the window $[x', x'+2e_i]$ contains the maximum number of elements, then the label x for node N is set to $x'+e_i$ (since this would minimize the number of outliers).

Regression Tree Construction with Integrated Building and Pruning

In the tree construction algorithm presented in the previous subsection, portions of tree R are pruned only after R is completely built. Consequently, the algorithm may expend substantial effort on building portions of the tree that are subsequently pruned. In this subsection, an algorithm is presented that, during the growing phase, first determines if a node will be pruned during the following pruning phase, and subsequently stops expanding such nodes. Thus, integrating the pruning phase into the building phase enables the algorithm to reduce the number of expanded tree nodes and improve performance. Although Rastogi et al., in the prior art, presented integrated algorithms for classification trees, the algorithms presented in this subsection are novel since in this case, regression trees are of primary interest and bounded errors are allowed in predicted values.

Recall that for a completely built regression tree R, for a non-leaf node N in R, N's children are pruned if, $C(N) \leq C(R_N)$ where $C(R_N)$ and $C(N)$ are the costs of encoding the subtree $R_N$ and node N (considering it to be a leaf), respectively. However, if R is a partially built regression tree, then $R_N$ may still contain some leaves that are eligible for expansion.

As a result, $C(R_N)$, the cost of the partial subtree $R_N$, may be greater than the cost of the fully expanded subtree rooted at N (after "still to be expanded" leaves in $R_N$ are completely expanded). This overestimation by $C(R_N)$ of the cost of the fully expanded subtree rooted at N can result in N's children being wrongly pruned (assuming that N's children are pruned if $C(N) \leq C(R_N)$).

Instead, suppose that for a "still to be expanded leaf" N, L(N) could be computed, a lower bound on the cost of any fully expanded subtree rooted at N. Further, suppose for a non-leaf node N, define $L(R_N)$ is defined to be the sum of (1) for each internal node N' in $R_N$, $1+\log(|X_i|)+C_{split}(N')$, (2) for each "still to be expanded" leaf node N' in $R_N$, L(N') and (3) for leaf nodes N' in $R_N$ that do not need to be expanded further and containing m outliers $1+(m+1)\log(|dom(X_i)|)$.

It is relatively straightforward to observe that $L(R_N)$ is indeed a lower bound on the cost of any fully expanded subtree rooted at node N. As a consequence, if $C(N) \leq L(R_N)$, then N's children can safely be pruned from R since C(N) would be less than or equal to the cost of the fully expanded subtree rooted at N and as a result, N's children would be pruned from R during the pruning phase anyway.

Thus, a lower bound L(N) simply needs to be estimated on the cost of any fully expanded subtree rooted at a "still to be expanded" leaf N. A simple estimate for the lower bound L(N) is $1+\min\{\log(|X_i|), \log(|dom(X_i)|)\}$. However, in the following, a better estimate for L(N) is shown:

Let $x_1, x_2, \ldots, x_r$ be the values of attribute $X_1$ for tuples in node N in sorted order. Suppose one is permitted to use k intervals of width $2e_i$ to cover values in the sorted list. Further, suppose one is interested in choosing the intervals such that the number of values covered is maximized, or alternately, the number of uncovered values (or outliers) is minimized. Let minOut (i,k) denote this minimum number of outliers when k intervals are used to cover values in $x_i, x_2, \ldots, x_1$. The following dynamic programming relationship holds for minOut (i,k). (In the third equation below, $1 \geq 0$ is the smallest index for which $x_i - x_{l+1} \leq 2_{e_i}$.)

$$\text{minOut (i,k)} = \begin{matrix} 0 & \text{if } i=0 \\ i & \text{if } k=0 \end{matrix}$$

min{minOut(i−1, k)+1, minOut(l,k−1)} otherwise

The second condition essentially states that with 0 intervals, the number of outliers in $x_1, \ldots, x_i$ is at least i. The final condition corresponds to the two cases for $x_i$: (1) $x_i$ does not belong to any of the k intervals (and is thus an outlier), and (2) $x_i$ belongs to one of the k intervals. The following theorem lays the groundwork to compute a good estimate for L(N) in terms of minOut defined above:

Theorem 2: For a leaf N that still remains to be expanded, a lower bound on the cost of a fully expanded subtree with k splits and rooted at N is at least $2k+1+k \log(X_i)+(k+1+\text{minOut}(r,k+1))\log(dom(X_i))$.

Turning now to FIG. 5, disclosed is one embodiment of a procedure LowerBound ( ), an algorithm for computing L(N) for each "still to be expanded" leaf N in the partial tree R. The LowerBound algorithm repeatedly applies Theorem 2 to compute lower bounds on the cost of subtrees containing O to b splits (for a fixed, user-specified constant b), and then returns the minimum from among them. In Steps 1–11, the procedure computes minOut values for 1 to b+1 intervals using the dynamic-programming relationship for minOut presented earlier. Then, the LowerBound algorithm sets L(N) to be the minimum cost from among subtrees containing at most b splits (Steps 13–14) and greater than b splits (Step 15). Note that $2b+3+(b+1)\log(X_i)+(b+2)\log(dom(X_i))$ is a lower bound on the cost of any subtree containing more than b splits.

It is straightforward to observe that the time complexity of LowerBound algorithm is O(rb). This is due to the two for loops in Steps 6 and 9 of the algorithm. Further, the algorithm scales for large values of r since it makes a single pass over all the values in node N. The algorithm also has very low memory requirements since for computing minOut for each i (Step 10), it only needs to store in memory minOut values for i−1 and l.

The RowAggregator 140

The CaRTSelector 120 of the table compressor 100 computes the set of attributes $\{X_1, \ldots, X_p\}$ to predict and the CaRT models $\{M_1, \ldots, M_p\}$ for predicting them. These models are stored in the compressed version $T_c$ of the table along with T', the projection of table T on predictor attributes. Obviously, by compressing T' one could reduce the storage overhead of $T_c$ even further. However, while lossless compression algorithms can be used to compress T' without any problems, when applying lossy compression algorithms to T' one needs to be more careful. This is because, with lossy compression, the value of a predictor attribute $X_i$ in T' may be different from its original value that was initially used to build the CaRT models. As a result, it is possible for errors that exceed the specified bounds, to be introduced into the values of predicted attributes.

The RowAggregator 140 of the table compressor 100 may use a fascicle-based algorithm, such as those disclosed in "Semantic Compression and Pattern Extraction with Fascicles" by Jagadish et al., in *Proceedings of the 25th International Conference on Very Large Data Bases*, published in Scotland in September 1999, and is hereby incorporated by reference in its entirety, to further compress the table T' of predictor attributes. Since fascicle-based compression is lossy, in the following, it is shown how the above mentioned scenario can be avoided when compressing numeric attributes using fascicles.

For a numeric predictor attribute $X_i$ define value v to be a split value for $X_i$ if $X_1 > v$ is a split condition in some CaRT $M_i$ in $T_c$. Also, in a fascicle (set of records), an attribute $X_i$ may be said to be compact if the range [x',x"] of $X_i$-values in the fascicle, in addition to having width at most $2e_i$, also satisfies the property that for every split value v, either x'>v or x"≤v.

In the fascicle-based compression algorithm of the table compressor 100, for each compact attribute $X_i$, by using (x'+x")/2 as the representative for $X_i$-values in the fascicle, it can be ensured that the error bounds for both predictor as well as predicted attributes are respected. In fact, it can be shown that the values for predicted attributes are identical prior to and after T' is compressed using fascicles. This is because for each tuple t in T', the original and compressed tuple traverse the same path in every CaRT $M_i$.

For instance, suppose that $X_i > v$ is a split condition in some CaRT and $t[X_1]$ is different after compression. Then if $t[X_i] > v$, it must be the case that for the fascicle containing t, for the $X_i$-value range [x',x"], x'>v. Thus, the compressed value for $t[X_1]((x'+x")/2)$ must also be greater than v. In a similar fashion, it can be shown that when $t[X_i] \leq v$, the compressed value of $t[X_i]$ is also less that or equal to v. Thus, a more strict definition of compact attributes prevents errors in predictor attributes from rippling through the predicted attributes. Further, the fascicle computation algorithms can be extended in a straightforward manner to compute fascicles containing k compact attributes (according to the new definition).

Experimental Study

The results of an extensive empirical study are presented. The objective of this empirical study was to compare the quality of compression model-based approach of the table compressor 100 with the existing syntactic (gzip) and semantic (fascicles) compression techniques. A wide range of experiments were conducted with three very diverse real-life data sets in which were measured both compression ratios as well as running times for the table compressor 100. The major findings of the study can be summarized as follows.

Better Compression Ratios

On all data sets, the table compressor 100 produced smaller compressed tables compared to gzip and fascicles. The compression due to the table compressor 100 was more effective for tables containing mostly numeric attributes, at times outperforming gzip and fascicles by a factor of 3 (for error tolerances of 5–10%). Even for error tolerances as low as 1% the compression due to the table compressor 100, on an average, was 20–30% better than existing schemes.

Small Sample Sizes are Effective

For the data sets, even with samples as small as 50 KB (0.06% of one data set), the table compressor 100 was able to compute a good set of CaRT models that result in excellent compression ratios. Thus, using samples to build the Bayesian network and CaRT models can speed up the table compressor 100 significantly.

Best Algorithms for Table Compressor 100 Functional Blocks

The MaxIndependentSet CaRT-selection algorithm compressed the data more effectively than the Greedy algorithm. Further, since the table compressor 100 spent most of its time building CaRT's (between 50% and 75% depending on the data set), the integrated pruning and building of CaRTs resulted in significant speedups to the table compressor 100's execution times.

These following experimental results validate the hypothesis that the table compressor 100 is a viable and effective system for compressing massive tables. All experiments reported in this section were performed on multi-processor (4 700 MHz Pentium processors) Linux server with a 1 GB of main memory.

Experimental Testbed and Methodology

Compression Algorithms

Three compression algorithms were considered in the above study:

Gzip. Gzip is a widely used lossless compression tool based on the Lempel-Ziv dictionary-based technique. The table is compressed row-wise using gzip after doing a lexicographic sort of the table. The lexicographic sort significantly outperformed the cases in which gzip was applied to a row-wise expansion of the table without the lexicographic sort.

Fascicles. Jagadish, et al. describe two algorithms, Single-k and Multi-k, for compressing a table using fascicles. They recommend the Multi-k algorithm for small values of k (the number of compact attributes in the fascicle), but the Single-k algorithm otherwise. In one embodiment of the table compressor 100, the Single-k algorithm is used. The two main input parameters to the algorithm are the number of compact attributes, k, and the maximum number of fascicles to be built for compression, P. In the above-referenced experiments, for each individual data set, values of k and P were used that resulted in the best compression due to the fascicle algorithm.

The Single-k algorithm was found to be relatively insensitive to P and P was chosen to be 500 for all three data sets. However, the sizes of the compressed tables output by Single-k did vary for different values of k and so for the Corel, Forest-cover and Census data sets (described below), k was set to 6, 36 and 9, respectively. Note that these large values of k justify the use of the Single-k algorithm. The minimum size m of a fascicle was set to 0.01% of the data set size. For each numeric attribute, the compactness tolerance was set to twice the input error tolerance for that attribute. However, since for categorical attributes, the the fascicle error semantics can differ from the fascicle error semantics of the table compressor 100, a compactness tolerance of "0" was used for every categorical attribute.

The Table Compressor 100

Various embodiments of the table compressor 100 system were implemented as described above. For the Greedy CaRT-selection algorithm, a value of 2 was used for the relative benefit parameter θ. In the MaxIndependentSet CaRT-selection algorithm, for finding the WMIS of the node-weighted graph $G_{temp}$, the QUALEX[2] software package was used, although those skilled in the art would understand that other software or hardware solutions might be implemented within the scope of the present invention. This software implements an algorithm based on a quadratic programming formulation of the maximum weighted clique problem. The running time is $O(n^4)$ (where n is the number of vertices in the graph).

In all of the experiments that were run, QUALEX always found the optimal solution and accounted for a negligible fraction of the overall execution time. The integrated building and pruning algorithm was also implemented in the BuildCaRT component, and a simple lower bound of $1+\min\{\log(|X_i|), \log(|\text{dom}(X_i)|)\}$ was used for every "yet to be expanded" leaf node. Finally, in the Row Aggregator component, the Single-k fascicle algorithm was employed, with P set to 500 and k equal to two-thirds of the number of attributes in T'. When comparing the table compressor 100 results with the use of fascicles, the error tolerance was set for the categorical attributes to always be 0.

Real-Life Data Sets

The following real-life data sets were used with every different characteristics in the experiments:

1. Census. This data set was taken from the Current Population Survey (CPS) data, which is a monthly survey of about 50,000 households conducted by the Bureau of the Census for the Bureau of Labor Statistics. Each month's data contains about 135,000 tuples with 361 attributes, of which 7 categorical attributes were used (e.g., age, hourly pay rate). In the final data set, data for 5 months was used (June through October 2000) that contained a total of 676,000 tuples and occupied 28.6 MB of storage.
2. Corel. This data set contains image features extracted from a Corel image collection. A 10.5 MB subset of the data set was used which contains the color histogram features of 68,040 photo images. This data set consists of 32 numerical attributes and contains 68,040 tuples.
3. Forest-cover. This data set contains the forest cover type for 30×30 meter cells obtained from US Forest Service (USFS) Region 2 Resource Information System (RIS) data. The 75.2 MB data set contains 581,000 tuples, and 10 numeric and 44 categorical attributes that describe the elevation, slope, soil type, etc. of the cells.

Default Parameter Settings

A critical input parameter to the compression algorithms is the error tolerance for numeric attribute $X_i$ is specified as a percentage of the width of the range of $X_i$-values in the table. Another important parameter to the table compressor 100 is the size of the sample that is used to select the CaRT models in the final compressed table. For these two parameters, the default values of 1% (for error tolerance) and 50 KB (for sample size), respectively, are used in all of the referenced experiments. Note that 50 KB corresponds to 0.065% to 0.475% and 0.174% of the total size of the Forest-cover, Corel and Census data sets, respectively. Finally, unless stated otherwise, the table compressor 100 always uses MaxIndependentSet for CaRT-selection and the integrated pruning and building algorithm for constructing regression trees.

Experimental Results

Effect of Error Threshold on Compression Ratio

Figure 6:
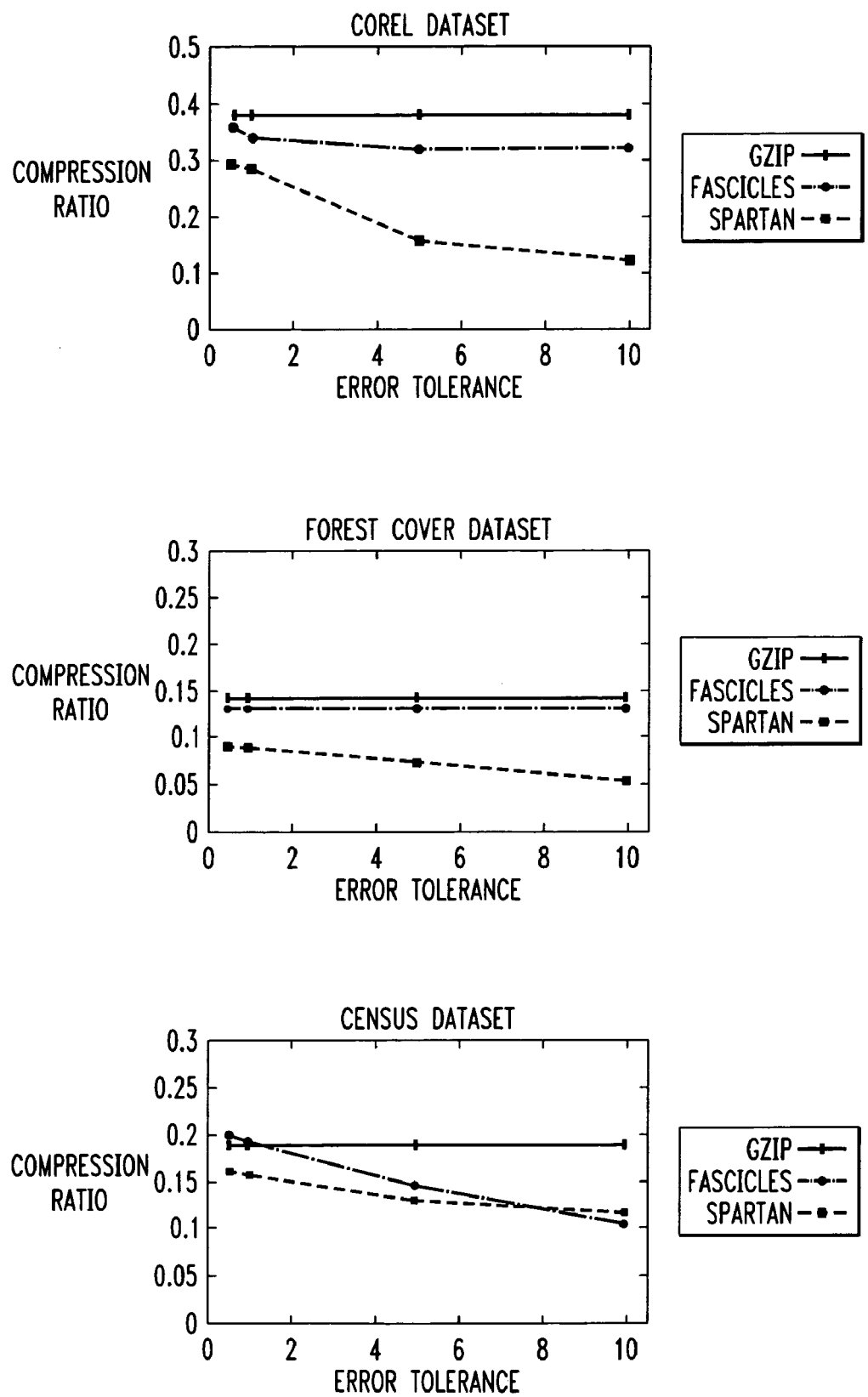
FIG. 6 illustrates diagrams for compression ratios for gzip, fascicles and the table compressor 100 for three data sets.

Turning now to FIG. 6, illustrated are graphs of compression ratios for gzip, fascicles and the table compressor 100 for the above three data sets. From FIG. 6, it is clear that the table compressor 100 outperforms both gzip and fascicles, on an average, by 20–30% on all data sets, even for a low error threshold value of 1%. The compression due to the table compressor 100 is especially striking for the Corel data set that contains only numeric attributes. For high error tolerances (e.g., 5–10%), the table compressor 100 produces a compressed Corel table that is almost a factor of 3 smaller than the compressed tables generated by gzip and fascicles, and a factor of 10 smaller than the uncompressed Corel table. Even for the Census data set, which contains an equal number of numeric and categorical attributes, the table compressor 100 compresses better than fascicles for smaller and moderate error threshold values (e.g., 0.5% to 5%); only for larger error bounds (e.g., 10%) do fascicles perform slightly better than the table compressor 100.

One reason why gzip does not compress the data sets as well as the other two compression schemes is that, unlike fascicles and the table compressor 100, gzip treats the table simply as a sequence of bytes and is completely oblivious of the error bounds for attributes. In contrast, both fascicles and the table compressor 100 exploit data dependencies between attributes and also the semantics of error tolerances for attributes. Further, compared to fascicles which simply cluster tuples with approximately equal attribute values, CaRTs are much more sophisticated at capturing dependencies between attribute columns. This is especially true when tables contain numeric attributes since CaRTs employ semantically rich split conditions for numeric attributes like $X^i > v$.

Another crucial difference between fascicle and CaRT-based compression is that, when fascicles are used for compression, each tuple and as a consequence, every attribute value of a tuple is assigned to a single fascicle. However, in the table compressor 100, a predictor attribute and thus a predictor attribute value (belonging to a specific tuple) can be used in a number of different CaRTs to infer values for multiple different predicted attributes. Thus, CaRTs offer a more powerful and flexible model for capturing attribute correlations than fascicles.

As a result, a set of CaRT predictors are able to summarize complex data dependencies between attributes much more succinctly than a set of fascicles. For an error constraint of 1%, the final Corel table compressor 100-compressed table contains 20 CaRTs that along with outliers, consume only 1.98 MB or 18.8% of the uncompressed table size. Similarly, for the Forest-cover data set, the number of predicted attributes in the compressed table is 21 (8 numeric and 13 categorical) and the CaRT storage overhead (with outliers) is a measly 4.77 MB or 6.25% of the uncompressed table.

The compression ratios for the table compressor 100 are even more impressive for larger values of error tolerance (e.g., 10%) since the storage overhead of CARTs+outliers is even smaller at these higher error values. For example, at 10% error, in the compressed Corel data set, CaRTs consumer only 0.6 MB or 5.73% of the original table size. Similarly, for Forest-cover, the CaRT storage overhead reduces to 2.84 MB or 3.72% of the uncompressed table. The only exception is the Census data set where the decrease in storage overhead is much steeper for fascicles than for CaRTs. One possible reason for the preceding is because of the small attribute domains in the Census data that cause each fascicle to cover a large number of tuples at higher error threshold values.

Effect of Random Sample Size on Compression Ratio

Figure 7A:
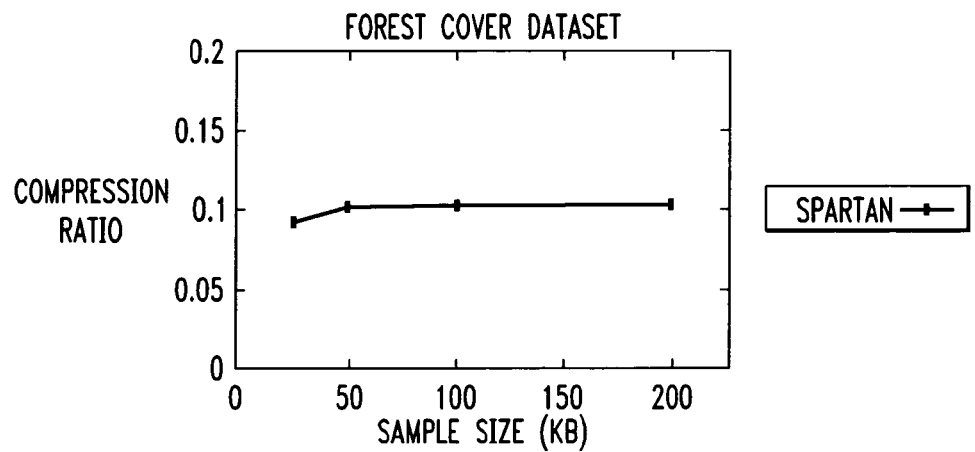
FIGS. 7A–C illustrate diagrams showing the effect of an error threshold and sample size on compression ratio/running time.
Figure 7B:
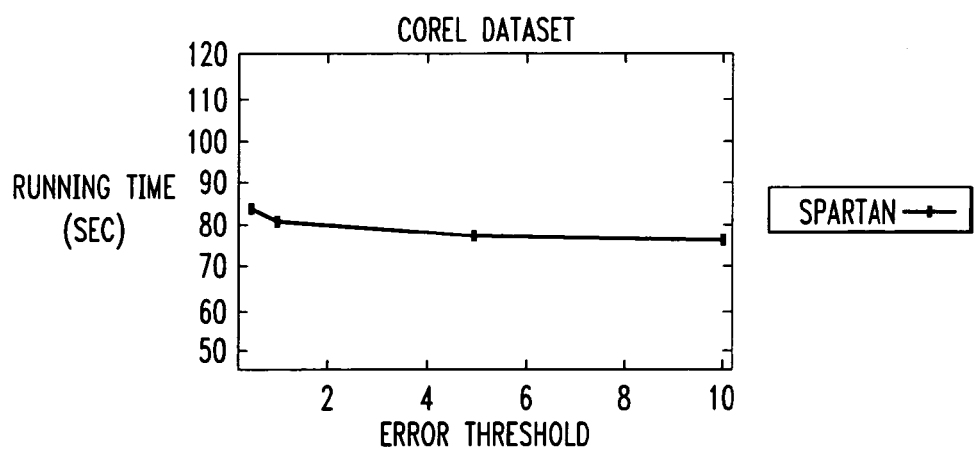
Figure 7C:
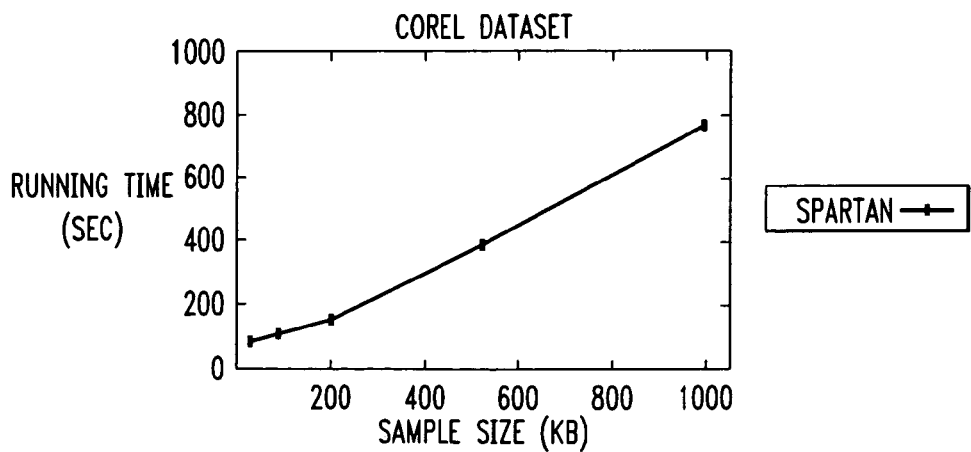

Turning now to FIGS. 7A–C, illustrated are graphs of the effect of an error threshold and sample size on compression ratio/running time. FIG. 7A illustrates the effect on compression ratio as the sample size is increased from 25 KB to 200 KB for the Forest-cover data set. Interestingly, even with a 25 KB sample, which is about 0.04% of the total data set size, the table compressor 100 is able to obtain a compression ratio of approximately 0.1, which is about 25% better than the compression ratio for gzip and fascicles. Further, note that increasing the sample size beyond 50 KB does not result in significant improvements in compression quality. The implication here is that it is possible to infer a good set of models even with a small random sample of the data set. This is significant since using a small sample instead of the entire data set for CaRT model construction can significantly improve the running time of the table compressor 100. The running time experiments are described below.

Effect of CaRT Selection Algorithm on Compression Ratio/Running Time

In Table 1, shown below, the compression ratios and running times of the CaRT-selection algorithms of the table compressor 100 are shown for the three data sets. Three CaRT—selection algorithms—Greedy, MaxIndependent-Set—were considered. The neighborhood for a node of the CaRT-selection algorithms was set to it parents and Max-IndependentSet with the neighborhood for a node set to it Markov blanket (in the Bayesian graph). From the Table 1, it follows that the MaxIndependentSet algorithms generally compress better than the Greedy algorithm. This is because the Greedy algorithm follows a very "local" prediction strategy for each attribute, basing the decision on whether or not to predict an attribute solely on how well it is predicted by its materialized ancestors in the Bayesian network graph.

In contrast, the MaxIndependentSet algorithm adopts a more "global" view when making a decision on whether to predict or materialize an attribute—specifically, it not only takes into account how well an attribute is predicted by attributes in its neighborhood, but also how well it predicts other attributes in its neighborhood. Observe that, in general, the version of MaxIndependentSet with the Markov blanket as a node's neighborhood performs slightly better than MaxIndependentSet with parents as the neighborhood.

With respect to running times, it was found that, in general, the MaxIndependentSet with parents performs quite well across all the data sets. This may be because the MaxIndependentSet constructs few CaRTs (118 for Census, 32 for Corel, and 46 for Forest-cover) and since it restricts the neighborhood for each attribute to only its parents, each CaRT contains few predictor attributes. While greedy does build the fewest CaRTS in most cases (10 for Census, 16 for Corel, and 19 for Forest-cover), all the materialized ancestors of an attribute are used as predictor attributes when building the CaRT for the attribute. As a result, since close to 50% attributes are materialized for the data sets, each CaRT is built using a large number of attributes, thus hurting greedy's performance.

Finally, the performance of MaxIndependentSet with Markov blanket suffers since it, in some cases, constructs a large number of CaRTs (56 for Census, 17 for Corel, and 138 for Forest-cover). Further, since the Markov blanket for a node contains more attributes than simply its parents, the number of predictor attributes used in each CaRT for Markov blanket is typically much larger. As a result, CaRT construction times for Markov blanket are higher and overall execution times for Markov blanket are less competitive.

TABLE 1

Effect of CaRT Selection Algorithm on Compression Ratio/Running Time.

| Data Set | Compression Ratio | | | Running Time (sec) | | |
|---|---|---|---|---|---|---|
| | Greedy | WMIS (Parent) | WMIS (Markov) | Greedy | WMIS (Parent) | WMIS (Markov) |
| Corel | 0.352 | 0.292 | 0.287 | 148.25 | 97.44 | 80.73 |
| Forest-cover | 0.131 | 0.106 | 0.1 | 932 | 670 | 1693 |
| Census | 0.18 | 0.148 | 0.157 | 205.77 | 153 | 453.35 |

Effect of Error Threshold and Sample Size on Running Time

In FIGS. 7B and 7C, the running times for the table compressor 100 for a range of error threshold values and sample sizes is plotted. Two trends in the FIGURES that are straightforward to observe are that the running time of the table compressor 100 decreases for increasing error bounds, and increases for larger sample sizes. One reason for the decrease in execution time when the error tolerance is increased is that for larger thresholds, CaRTs contain fewer nodes and so CaRT construction times are smaller. For instance, CaRT construction times (which constitute approximately 50–75% of the table compressor's 100 total execution time) reduce by approximately 25% as the error bound increases from 0.5% to 10%. Note the low running times for the table compressor 100 on the Corel data set.

In FIG. 7C, the running time of the table compressor 100 is plotted against the random sample size instead of the data set size. This plot is included in the experimental results in part because the DependencyFinder 110 and CaRTBuilder 130 of the table compressor 100 account for most of the running time of the table compressor 100 (on an average, 20% and 75%, respectively) use the sample for model construction. The table compressor 100 makes very few passes over the entire data set (e.g., for sampling, for identifying outliers in the data set for each selected CaRT and for compressing T' using fascicles), the overhead of which is negligible compared to the overhead of CaRT model selection. Observe that the performance of the table compressor 100 scales almost linearly with respect to the sample size.

Finally, in experiments with building regression trees on the data sets, the integrating the pruning and building phases can result in significant reductions in the running times of the table compressor 100. This may be because integrating the pruning and building phases causes fewer regression tree nodes to be expanded (since nodes that are going to be pruned later are not expanded), and thus improves CaRT building times by as much as 25%.

Although the present invention has been described in detail, those skilled in the art should understand that they can make various changes, substitutions and alterations herein without departing from the spirit and scope of the invention in its broadest form.

What is claimed is:

1. A data table compressor, comprising:
   a table modeller that discovers at least one model of data mining models with guaranteed error bounds of at least one attribute in a data table in terms of other attributes in different columns of said data table;
   a model selector, associated with said table modeller, that selects a subset of said at least one model to form a basis upon which to compress said data table to form a compressed data table; and
   a row aggregator that employs said selected subset from said model selector to improve a compression ratio of said compressed data table via row-wise clustering.

2. The data table compressor as recited in claim 1 wherein said table modeller employs classification and regression tree data mining models to model said at least one attribute.

3. The data table compressor as recited in claim 2 wherein construction of said models uses integrated building and pruning to exploit specified error bounds and decrease model construction time.

4. The data table compressor as recited in claim 2 wherein values for said at least one attribute are represented in said compressed data table by at least one of said classification and regression tree data mining models and are not explicitly stored therein.

5. The data table compressor as recited in claim 1 wherein said model selector employs a Bayesian network built on said at least one attribute to select relevant models for table compression.

6. The data table compressor as recited in claim 1 wherein said table modeller employs a selected one of a constraint-based and a scoring-based method to generate said at least one model.

7. The data table compressor as recited in claim 1 wherein said model selector selects said subset based upon a compression ratio and an error bound specific for each attribute of said data table.

8. The data table compressor as recited in claim 1 wherein said model selector selects said subset using a model built on attributes of said data table by a selected one of:
   repeated calls to a maximum independent set solution algorithm, and
   a greedy search algorithm.

9. A method of compressing a data table, comprising:
   discovering at least one model of data mining models with guaranteed error bounds of at least one attribute in said data table in terms of other attributes in different columns of said data table;
   selecting a subset of said at least one model to form a basis upon which to compress said data table; and
   employing said selected subset to improve a compression ratio of said compressed data table via row-wise clustering.

10. The method as recited in claim 9 wherein said discovering comprises employing classification and regression tree data mining models to model said at least one attribute.

11. The method as recited in claim 10 further comprising using integrated building and pruning to exploit specified error bounds and decrease model construction time.

12. The method as recited in claim 9 wherein said discovering comprises employing a Bayesian network built on said at least one attribute to select relevant models for table compression.

13. The method as recited in claim 9 wherein said discovering comprises employing a selected one of a constraint-based and a scoring-based method to generate said at least one model.

14. The method as recited in claim 9 wherein said selecting comprises selecting said subset based upon a compression ratio and an error bound specific for each attribute of said data table.

15. The method as recited in claim 9 wherein said selecting is NP-hard.

16. The method as recited in claim 9 wherein said selecting comprises selecting said subset using a model built on attributes of said data table by a selected one of:
   repeated calls to a maximum independent set solution algorithm, and
   a greedy search algorithm.

17. A database management system, comprising:
   a data structure having at least one data table therein;
   a database controller for allowing data to be provided to and extracted from said data structure; and
   a system for compressing said at least one data table, including:
      a table modeller that discovers at least one model of data mining models with guaranteed error bounds of at least one attribute in said data table in terms of other attributes in different columns of said data table,
      a model selector, associated with said table modeller, that selects a subset of said at least one model to form a basis upon which to compress said data table to form a compressed data table, and
      a row aggregator that employs said selected subset from said model selector to improve a compression ratio of said compressed data table via row-wise clustering.

18. The system as recited in claim 17 wherein said table modeller employs classification and regression tree data mining models to model said at least one attribute.

19. The system as recited in claim 18 wherein construction of said models uses integrated building and pruning to exploit specified error bounds and decrease model construction time.

20. The system as recited in claim 17 wherein said model selector employs a Bayesian network built on said at least one attribute to select relevant models for table compression.

21. The system as recited in claim 17 wherein said table modeller employs a selected one of a constraint-based and a scoring-based method to generate said at least one model.

22. The system as recited in claim 17 wherein said model selector selects said subset based upon a compression ratio and an error bound specific for each attribute of said data table.

23. The system as recited in claim 17 wherein said model selector selects said subset using a model built on attributes of said data table by a selected one of:
   repeated calls to a maximum independent set solution algorithm, and
   a greedy search algorithm.

* * * * *